(12) United States Patent
Nadkarni et al.

(10) Patent No.: US 10,537,039 B2
(45) Date of Patent: *Jan. 14, 2020

(54) INDUCTANCE-BASED USER INTERFACE ELEMENTS

(71) Applicant: Fitbit, Inc., San Francisco, CA (US)

(72) Inventors: Aditya Vivekanand Nadkarni, San Bruno, CA (US); Allen Yu-Li Wang, Mountain View, CA (US); Benjamin Patrick Robert Jean Riot, San Francisco, CA (US); Reza Yazdani, San Francisco, CA (US); Dennis Alejandro Grijalva, Carlsbad, CA (US); Edison Tam King Miguel, Newark, CA (US); Vaibhav Kiran Mistry, San Francisco, CA (US); Yonghua Wei, San Diego, CA (US)

(73) Assignee: Fitbit, Inc., San Francisco, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/194,038

(22) Filed: Nov. 16, 2018

(65) Prior Publication Data
US 2019/0215977 A1 Jul. 11, 2019

Related U.S. Application Data

(63) Continuation of application No. 16/114,068, filed on Aug. 27, 2018, now Pat. No. 10,136,543, which is a
(Continued)

(51) Int. Cl.
*H01Q 1/12* (2006.01)
*H01Q 1/24* (2006.01)
(Continued)

(52) U.S. Cl.
CPC .......... *H05K 7/1427* (2013.01); *G06F 1/163* (2013.01); *G06F 1/1656* (2013.01);
(Continued)

(58) Field of Classification Search
CPC ......... H01Q 1/24; H01F 27/36; H01F 27/365; H01F 38/14; H01F 1/147; H01F 27/02;
(Continued)

(56) References Cited

U.S. PATENT DOCUMENTS 4,397,035 A * 8/1983 Nothnagel ............... H04B 1/03
343/872
5,532,705 A * 7/1996 Hama .................... H01Q 1/273
343/702
(Continued)

OTHER PUBLICATIONS

U.S. Notice of Allowance dated Oct. 11, 2018, in U.S. Appl. No. 16/114,068.
(Continued)

*Primary Examiner* — Tho G Phan
(74) *Attorney, Agent, or Firm* — Weaver Austin Villeneuve & Sampson LLP

(57) ABSTRACT

Mechanisms for providing inductance-based user interface elements are provided. Some implementations of such inductance-based devices may feature very small gaps between the housing and the inductive coil, as well as various features to aid in improving sensor sensitivity and reducing the possibility of false button-push events.

21 Claims, 11 Drawing Sheets

Related U.S. Application Data continuation of application No. 15/997,071, filed on Jun. 4, 2018, now abandoned, which is a continuation-in-part of application No. 15/842,689, filed on Dec. 14, 2017, now Pat. No. 10,320,063.

(60) Provisional application No. 62/433,994, filed on Dec. 14, 2016.

(51) Int. Cl.
| | |
|---|---|
| *G06F 3/044* | (2006.01) |
| *H01F 27/36* | (2006.01) |
| *H05K 7/14* | (2006.01) |
| *G06F 1/16* | (2006.01) |
| *H01F 17/00* | (2006.01) |

(52) U.S. Cl.
CPC ....... *G06F 1/1698* (2013.01); *H01F 17/0006* (2013.01); *H01F 17/0013* (2013.01); *H01F 2017/006* (2013.01)

(58) Field of Classification Search
CPC .......... H01F 27/28; H01F 27/288; G06F 3/04; G06F 3/041; G06F 3/044; G06F 3/0412; G06F 3/0414; G02F 1/13; G02F 1/1333
See application file for complete search history.

(56) References Cited

U.S. PATENT DOCUMENTS

| | | | | |
|---|---|---|---|---|
| 5,589,840 | A * | 12/1996 | Fujisawa | H01Q 1/273 |
| | | | | 343/718 |
| 5,926,144 | A * | 7/1999 | Bolanos | G04B 47/025 |
| | | | | 343/718 |
| 8,896,548 | B2 * | 11/2014 | Chang | G01R 27/2605 |
| | | | | 345/173 |
| 9,106,095 | B2 * | 8/2015 | Tom | G06F 1/26 |
| 9,417,743 | B2 * | 8/2016 | Liao | G06F 3/044 |
| 9,460,846 | B2 * | 10/2016 | Graham | H01F 27/365 |
| 10,136,543 | B1 * | 11/2018 | Nadkarni | H05K 7/1427 |
| 2018/0166772 | A1 | 6/2018 | Wei et al. | |

OTHER PUBLICATIONS

Kasemsadah et al., "Inductive Sensing Touch-On-Metal Buttons Design Guide," Texas Instruments Application Report, Jun. 2016. 21 pgs.

Oberhauser, "LDC Sensor Design," Texas Instruments Application Report, Mar. 2015. 24 pgs.

Yu et al., "Inductive Touch System Design Guide for HMI Button Applications," Texas Instruments Application Report, Feb. 2017. 26 pgs.

* cited by examiner

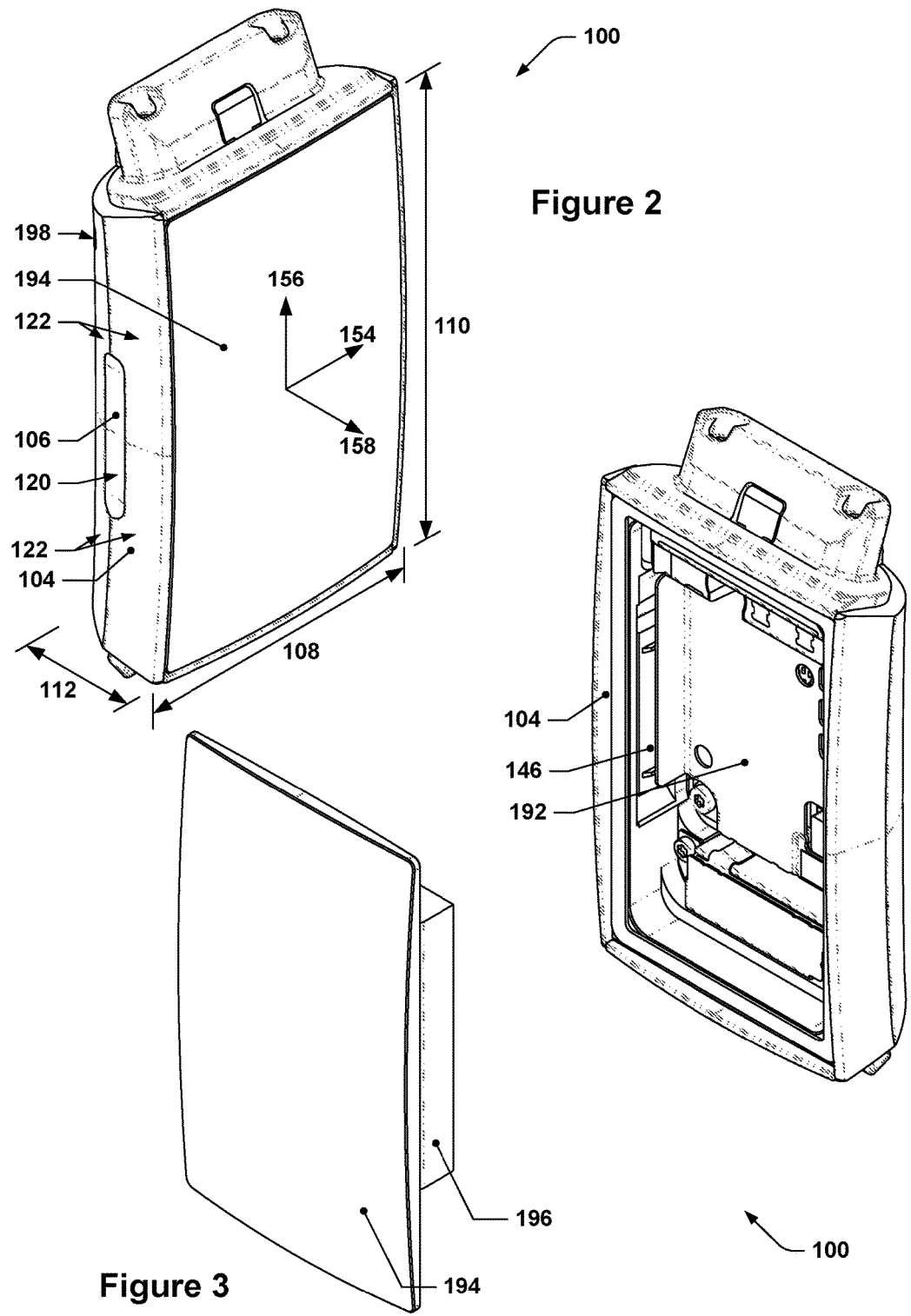

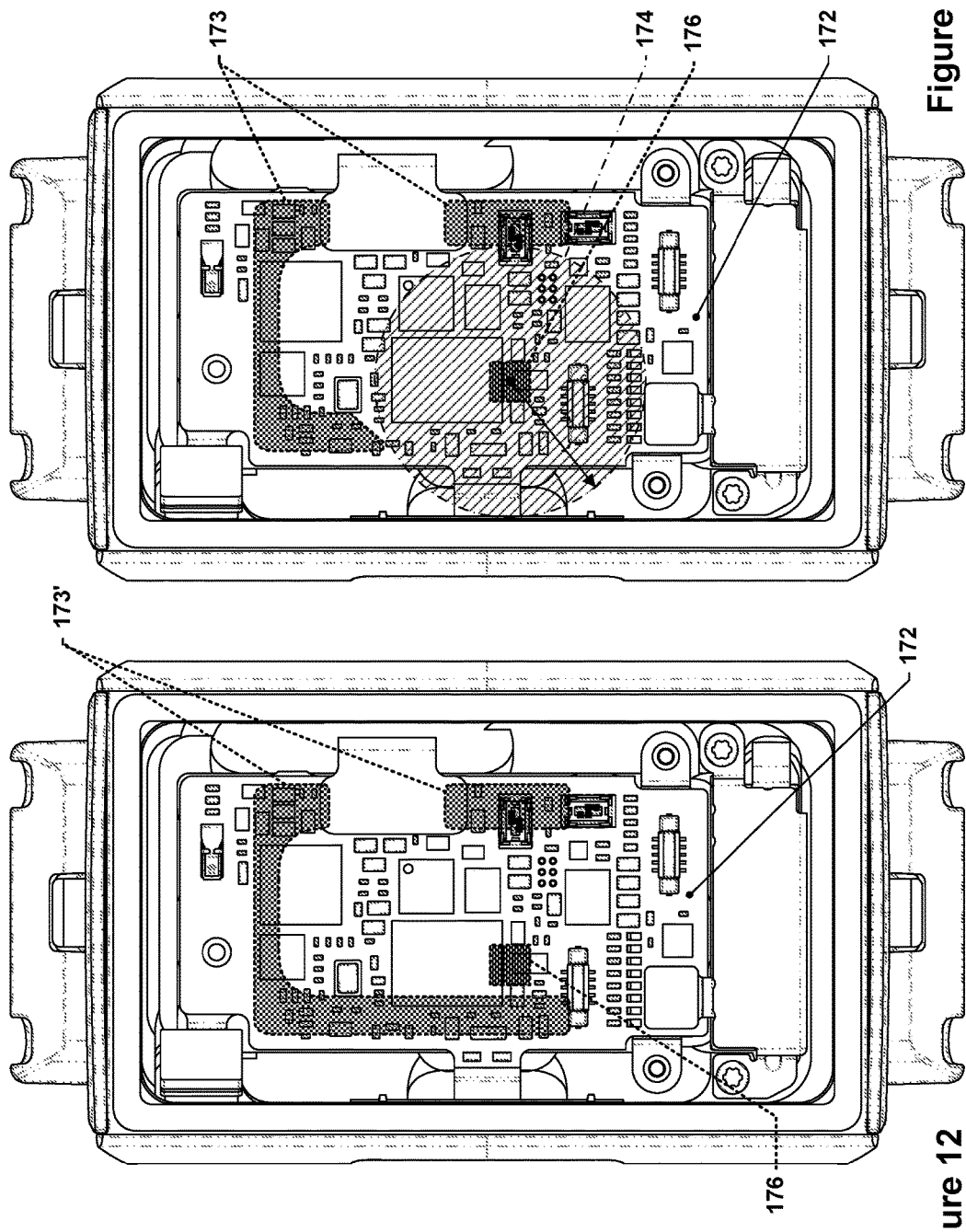

INDUCTANCE-BASED USER INTERFACE ELEMENTS

CROSS-REFERENCE TO RELATED APPLICATIONS

This application is a continuation application claiming priority under 35 U.S.C. § 120 from pending U.S. patent application Ser. No. 16/114,068, filed on Aug. 27, 2018, titled "INDUCTANCE-BASED USER INTERFACE ELEMENTS," which is itself a continuation of U.S. patent application Ser. No. 15/997,071, filed on Jun. 4, 2018, titled "INDUCTANCE-BASED USER INTERFACE ELEMENTS," which is itself a continuation-in-part of U.S. patent application Ser. No. 15/842,689, filed on Dec. 14, 2017, titled "METHODS FOR SLOT ANTENNA DESIGN FOR WEARABLE ELECTRONIC DEVICES AND CONDUCTIVE HOUSINGS," which itself claims benefit of priority under 35 U.S.C. § 119(e) to U.S. Provisional Patent Application No. 62/433,994, filed Dec. 14, 2016, which are all incorporated herein by reference in their entireties for all purposes.

BACKGROUND

Wearable devices, such as watches or personal fitness and health monitoring devices, which may be referred to as biometric monitoring devices or fitness trackers herein, may be worn by a user on various locations on the user's body, such as around the user's wrist. Such devices may often include one or more buttons or other user interface elements that allow a user to, for example, page through various display screens, start timers, or otherwise affect functionality of the device.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided that includes a housing having a first interior surface, a substrate proximate to the first interior surface and separated from the first interior surface by a first gap along a first axis perpendicular to the first interior surface, and one or more compressive diodes interposed between the first interior surface and the substrate. The substrate may include one or more inductive button coils and may be a flexible printed circuit (FPC) or a rigid printed circuit board (PCB). In such implementations, the first interior surface may be planar, the one or more compressive diodes may have a thickness in a direction perpendicular to the first interior surface that is equal to the first gap, the first gap may be between 0.02 mm and 0.2 mm, and the first interior surface, the substrate, the one or more inductive button coils, and the one or more compressive diodes may form part of an inductive button.

In some implementations, the first gap may be less than or equal to 0.1 mm. In some other implementations, the first gap may be less than 0.1 mm.

In some implementations, the one or more inductive button coils may include a first inductive button coil with an obround, rectangular, or elliptical spiral shape having a long dimension in a direction parallel to the substrate of approximately 8.3 mm±0.1 mm and a short dimension in another direction parallel to the substrate of 2.8 mm±0.1 mm, and the first inductive button coil may have at least between 7 and 8 loops. In some implementations, the one or more inductive button coils may include a first inductive button coil with an obround, rectangular, or elliptical spiral shape having a long dimension in a direction parallel to the substrate of approximately 8.3 mm±6 mm and a short dimension in another direction parallel to the substrate of 2.8 mm±2 mm, and the first inductive button coil may have at least between 2 and 15 loops. In some such implementations, the first inductive button coil may have an inductance of 0.5 to 5 uH.

In some implementations, the one or more inductive button coils may include a second inductive button coil identical to the first inductive button coil but located on a different layer of the substrate and coiling in an opposite direction, and the first inductive button coil may be in electrical series with the second inductive button coil.

In some implementations, the one or more compressive diodes may each include a spacer layer and an adhesive layer, the adhesive layer may adhere a first side of the spacer layer to the substrate, and a second side of the spacer layer may contact the first interior surface without adhesion.

In some implementations, the one or more compressive diodes may each include a spacer layer and an adhesive layer, the adhesive layer may adhere a first side of the spacer layer to the first interior surface, and a second side of the spacer layer may contact the substrate without adhesion.

In some implementations, the apparatus may further include an inductance-to-digital converter (LDC) electrically coupled to the one or more inductive button coils and configured to measure changes in inductance of the one or more inductive button coils responsive to deformation of the first interior surface.

In some implementations of the apparatus, the apparatus may further include a vibramotor and a controller including a memory and one or more processors. The one or more processors, the memory, the vibramotor, and the LDC may be operatively connected, and the memory may store instructions for controlling the one or more processors to: receive a signal from the LDC indicative of a change in inductance of the one or more inductive button coils and cause the vibramotor to generate a vibratory output responsive to the signal.

In some implementations of the apparatus having an LDC, the apparatus may further include a first printed circuit board (PCB) and the LDC may mounted to a surface of the first PCB that faces towards a bottom interior surface of the housing. The first PCB may be mounted in the housing such that there are no compressive load paths between the bottom interior surface of the housing and the first PCB within a first region centered on the LDC, the first region may, when viewed along the first axis, be a circular region with a diameter of at least 4 mm, and the LDC may, due to the absence of the compressive load paths within the first region, be substantially mechanically isolated from deflections in the housing, thereby reducing electrical transients caused by flexure of the LDC.

In some such implementations of the apparatus, the apparatus may include one or more PCB spacers interposed between the first PCB and the bottom interior surface, the one or more PCB spacers providing compressive load paths between the first PCB and the bottom interior surface, wherein each PCB spacer is a generally planar piece of electrically non-conductive material.

In some implementations of the apparatus, the housing may have a second interior surface, the first interior surface may face towards the second interior surface such that a normal of the first interior surface intersects with the second interior surface, and the first interior surface may be an undercut surface.

In some implementations of the apparatus, the housing may include a first exterior surface that overlaps with the first interior surface when viewed along the first axis, the first exterior surface may be less than or equal to 20 mm in length and less than or equal to 12 mm in width, and the housing may further include one or more second exterior surfaces that are adjacent to the first exterior surface. In such implementations, the first exterior surface may form a discontinuity in the one or more second exterior surfaces, a first distance between the first interior surface and the first exterior surface in a direction parallel to the first axis may be less than or equal to 1.5 mm, and the first distance may be the shortest distance between the first interior surface and the first exterior surface.

In some implementations of the apparatus, the first exterior surface may have a concave cross-section.

In some implementations of the apparatus, the apparatus may also include a stiffener, the substrate and the one or more compressive diodes may be interposed between the first interior surface and the stiffener, the substrate may be a flexible printed circuit (FPC) with conductive traces that provide the one or more inductive button coils, the substrate may be adhered or bonded to the stiffener, and the stiffener may have a Young's modulus of at least 15 GPa and a thickness of 0.3 mm or higher.

In some implementations of the apparatus, the apparatus may further include one or more compression spacers, a compressive load spreader, and a load structure. In such implementations, the one or more compression spacers may be made of an elastomeric material, the one or more compression spacers may be interposed between the compressive load spreader and the stiffener, the compressive load spreader may be made of a non-elastomeric material, and the load structure may be configured to apply a compressive load to the compressive load spreader, thereby clamping the substrate in place relative to the housing.

In some implementations, the housing may be for a wrist-wearable device, the first interior surface may have an upper edge that is located furthest from the person's wrist when the apparatus is worn on the person's wrist, and the load structure and the compressive load spreader may be configured to transfer compressive loads from the load structure to the compressive load spreader through a contact area with a load centroid that is, when viewed along the first axis, in a region interposed between the upper edge and a center axis that is generally parallel to the upper edge and that passes through a point located in the middle of the one or more inductive coils when viewed along the first axis.

In some implementations, the upper edge and the center axis may be separated by a first distance when viewed along the first axis, and the region may extend from 25% of the first distance to 75% of the first distance.

In some implementations of the apparatus, the apparatus may further include a slot antenna formed, at least in part, by the first interior surface of the housing and an electrically conductive surface offset from the first interior surface along the first axis. The apparatus may also, in such implementations, include one or more radio-frequency system components configured to generate or receive radio-frequency signals using the slot antenna, an inductance-to-digital converter (LDC) electrically coupled to the one or more inductive button coils via a plurality of electrically conductive paths and configured to measure changes in inductance of the one or more inductive button coils responsive to deformation of the first interior surface, and a plurality of decoupling inductors. In such implementations, the housing may be electrically conductive, each decoupling inductor may be located in series along a corresponding one of the electrically conductive paths such that electrical current flowing through each electrically conductive path flows through the corresponding decoupling inductor, the substrate and the one or more inductive button coils may be interposed between the first interior surface and the electrically conductive surface, and the decoupling inductors may not overlap with the one or more inductive coils when viewed along the first axis.

In some implementations of the apparatus, the slot antenna may be sized to provide functionality in the 2.4 to 2.5 GHz frequency band range, and each decoupling inductor may have an inductance of 33 nH or higher.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIG. 2 depicts the apparatus of FIG. 1, but with the straps omitted.

FIG. 3 depicts the housing of FIG. 2 with the display and a battery removed, revealing various internal components mounted within the housing.

FIGS. 12 and 13 depict plan views of the interior of the example apparatus of FIG. 1 with different PCB spacers shown in each Figure.

FIGS. 1 through 13 are drawn to-scale within each Figure, although not necessarily to the same scale from Figure to Figure.

DETAILED DESCRIPTION

Figure 1:
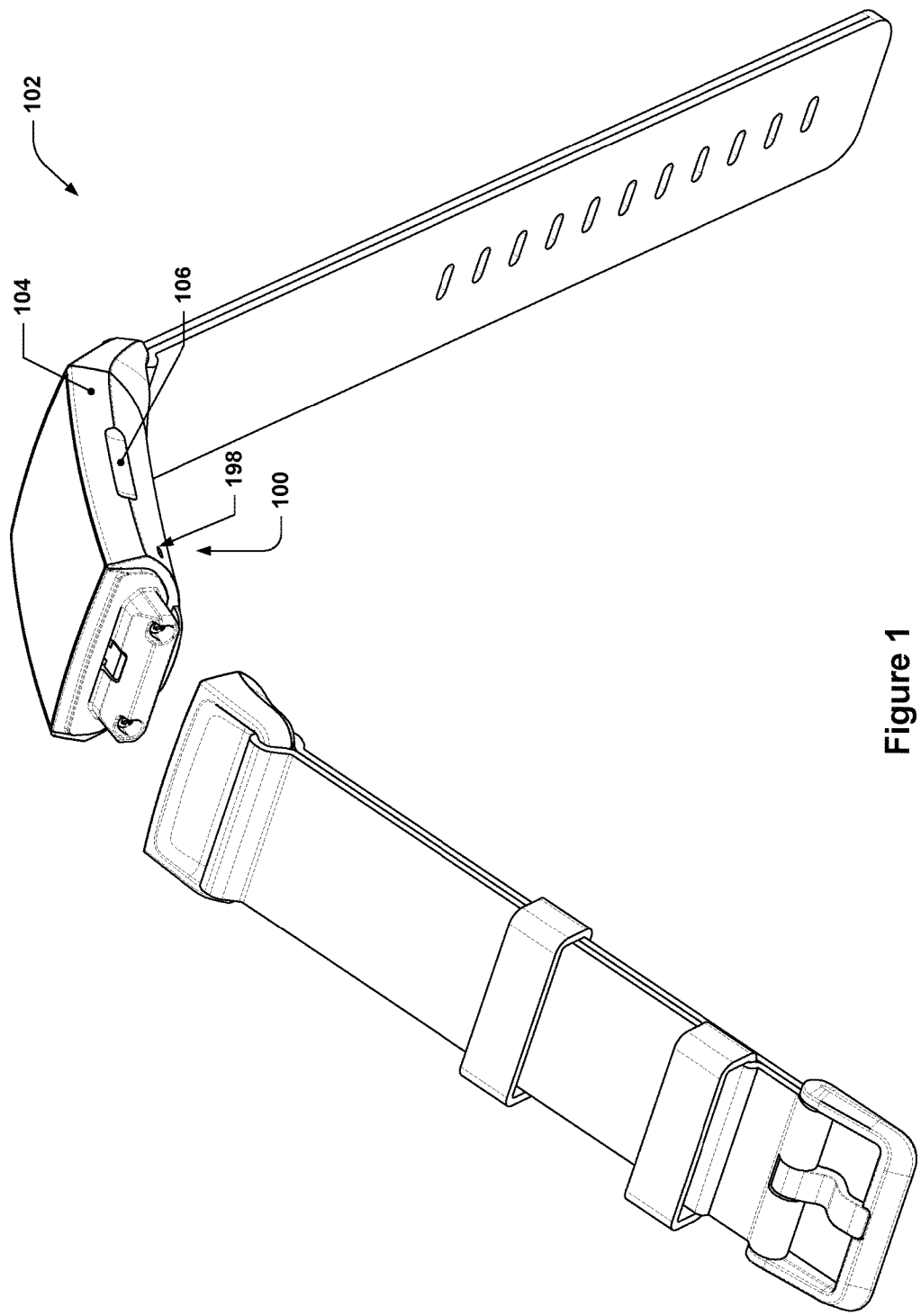
FIG. 1 depicts an example wearable device.

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

Inductive buttons or user interface elements are a relatively recent development in the field of human-machine interfaces. The general principle of operation is that an inductive coil is placed in proximity to a metal surface such that deformations of the metal surface caused, for example, by pushing on the metal surface with a finger, cause changes in the inductance of the inductive coil that may be detected as a "button push." Such inductance changes may, for example, be detected using an inductance-to-digital converter (LDC), such as a Texas Instruments LDC1000, which may output a digital signal indicating the measured inductance.

The performance of an inductive button is governed by multiple characteristics of the button, including inductive coil size/inductance, distance between the inductive coil and the metal surface, and the stiffness of the metal surface. For example, the stiffer the metal surface is, the more effort it will require to deflect the metal surface to produce a change in inductance that can be reliably detected. Thus, it is generally recommended, for example, to make inductive buttons that are sized large enough for a human finger to press on them, e.g., 20 mm in diameter, and to make such buttons flat, e.g., by making the metal button surface out of a piece of sheet metal.

With respect to the distance between the inductive coil and the metal surface, it is generally preferable to keep this distance at 0.2 mm or higher or 0.1 mm or higher, as this provides sufficient room for deflection of the metal surface without contacting the inductive coil/sensor and provides sufficient additional cushion to accommodate manufacturing tolerances.

The present inventors did extensive research into implementing inductive button technologies within the constraints of a wearable device, such as a watch or a wearable fitness monitor. The present inventors were not aware of any prior instance in which an inductive button had been implemented in a wearable device, likely because such devices are quite small and generally incompatible with typical inductive button design guidelines. For example, the specific device in which the button was to be implemented was a wearable fitness monitor with a housing that was approximately 20 mm wide by 35 mm long by 10 mm deep. The 20 mm by 30 mm surface was occupied by a display, leaving only a very small amount of real estate along the sides of the device housing in which to incorporate an inductive button. At the same time, the housing also did not have any flat, exterior surfaces—every surface was curved in some manner. Accordingly, there was no space for the recommended 20 mm diameter button, and also no ability to provide a flat inductive button surface. At the same time, the interior volume of the housing available for packaging the inductive button components was extremely limited, as that same volume is also used to package the battery, accelerometers, pressure sensors, near field communications antenna, circuit boards, display components, charging components, radio frequency transmitter/receiver components, a vibramotor, cabling, fasteners, stiffeners, brackets, and so forth. For example, in the housing depicted below in FIG. 1 and the following Figures, there may be less than 4 cubic centimeters, e.g., 3.9 cubic centimeters of internal packaging volume in total.

FIG. 1 depicts an example wearable device. Example wearable device 102 includes removable straps that may be attached to apparatus 100, which includes a housing 104 with an inductive button 106 on one side. The presence of the inductive button, in this example, is indicated by a scalloped groove or concave "scoop" feature along the side of the housing. In this example, the "scoop" is approximately 11 mm in length and 2 mm in width and has been machined using, for example, a 0.25" ball-nose milling cutter, although such features may, depending on the implementation, be designed to have other dimensions as well, e.g., dimensions within the range of 5 mm to 20 mm in length and 1.5 mm to 12 mm in width.

FIG. 2 depicts the apparatus 100 of FIG. 1, but with the straps omitted. The housing 104 may feature a top surface that provides a display 194, ends that attach or are attached to straps, a back side that may contact a person's wrist when worn, and side surfaces that may be used to accommodate buttons, such as the inductive buttons discussed herein. In this example, the left side surface of the housing 104 features the inductive button 106, which may be indicated through the use of a first exterior surface 120, which is concave in this example. The first exterior surface 120 may be surrounded by second exterior surfaces 122. One second exterior surface 122 shown in FIG. 2 is a sloped surface that follows a shallow arcuate path (the exterior surface 122 that is interposed between the first exterior surface 120 and the display 194), whereas the other second exterior surface 122 is curved or rounded and follows a similar shallow arcuate path. These two second exterior surfaces 122 may meet in a generally non-tangent manner so as to produce a discernible edge (this edge itself may be rounded to present a less sharp transition, but may still be discernible). In this example, the first exterior surface 120 is an obround scalloped area that has a long axis that is centered on the edge that is formed by the intersection of the two second exterior surfaces 122, although in other implementations, other arrangements of exterior surfaces may be used as well, e.g., a milled recess. In other implementations, the first exterior surface 122 may have contouring which matches that of the second exterior surfaces 122, i.e., the first exterior surface 120 may simply be subsumed into the second exterior surfaces 122. In such implementations, the inductive button area may be indicated through some other mechanism, such as through use of a different surface texture (such as a knurled or ridged surface texture as compared to a smooth surface texture) or by a visual (but non-tactile) indicator, such as a different-color outline.

To give some sense of scale to FIG. 2, the housing 104 that is shown may have a width 108 along a first axis 154 that is approximately 20 mm, a length 110 along a second axis 156 that is approximately 35 mm, and a thickness 112 along a third axis 158 that is approximately 10 mm.

FIG. 3 depicts the housing of FIG. 2 with the display 194 and a battery 196 removed, revealing various internal components mounted within the housing 104, such as compressive load spreader 146 and antenna bracket 192. Antenna bracket 192 may, for example, be present in apparatuses that feature wireless radio frequency (RF) communications interfaces. In this example, the antenna bracket 192 is electrically isolated from the housing 104 and a slot gap is formed between the antenna bracket 192 and the housing 104 along the first axis 154 and the second axis 156. Two or three electrical connection points, e.g., grounding points, can be added between antenna bracket 192 and the housing 104, in this example, by utilizing the electric contact through the two metal screws or the metal spring clip to govern the "length" of the slot gap (the slot gap is essentially bracketed between such electrical contact points, thereby defining the length of the slot gap). The housing 104, which, in this case, is metal, and the antenna bracket 192 (or, more accurately, an electrically conductive surface thereof), by virtue of this gap, may form a slot antenna that may be designed for use in the Bluetooth antenna frequency bands, e.g., 2.4 GHz to 2.5 GHz, or some other desired frequency band(s). Such slot antennas are discussed in more detail in U.S. patent application Ser. No. 15/842,689, filed Dec. 14, 2017, and U.S.

patent application Ser. No. 62/433,994, filed Dec. 14, 2016, both of which are hereby incorporated by reference in their entireties (the "antenna bracket" in these two applications may simply be referred to as a "metal bracket," such as is shown in FIGS. 10A and 10B of U.S. patent application Ser. No. 15/842,689.

In other implementations, the antenna bracket 192 may not be included, e.g., if radio communications interfaces are not provided or if a different antenna structure is used. However, in the depicted example, the antenna bracket 192 acts to press the compressive load spreader 146 towards the left side of the housing 104, i.e., towards the first exterior surface 120. In other implementations, other load structures may be used to press the compressive load spreader 146 in this direction, e.g., a bracket that is not part of an RF assembly or the edge of a PCB.

In order to implement an inductive button in such a miniature housing, the present inventors chose to depart from recommended inductive button practice in several respects. For example, a typical inductive button uses a metal surface with a uniform cross section or thickness over the sensor area, e.g., much like the membrane over a drum. Thus, when a load is applied to the center of the button area, the surface deflects in the same manner as a drum head would. For a given minimum thickness, a flat membrane will generally produce the greatest amount of deflection per a given amount of force applied to the center of the button than any other cross-sectional profile. The ability of an inductive button to detect a button press is generally governed by both the sensitivity of the inductive coil (which is limited by size) and the amount of deflection in the metal surface experienced in response to the button press (the amount of deflection must generally cause a change in inductance that is larger than the system noise in the electrical circuit in order to be recognizable as a button press). The amount of deflection is, of course, dependent on the amount of force applied to the surface, but this amount of force is generally constrained by the amount of force that a human finger can comfortably exert on the button. Finger-actuatable mechanical buttons (those with discrete moving parts) may typically be designed to require 2N to 5N of actuation force, but people will generally expect to exert less force on buttons that do not have moving parts (similar to how they would exert less force on a touch-screen display, for example), and may therefore not push a button such as an inductive button with as much force. For example, a typical person may exert a force of 0.5N to 2N on an inductive button in the expectation that it will register the button push; the present inventors conducted studies that indicated that a typical person, in the context of buttons for wrist-wearable devices, may exert typical forces of 1N to 4N on a wrist-wearable device button, and targeted a nominal button actuation force of 3N in view of such data. Because the forces that are expected to be applied to inductive buttons are so low, such buttons are preferably designed to maximize deflection of the button surface so as to produce enough deflection in response to such minute applications of force that a button push can be detected against the inherent system noise of the button circuit.

In contrast, the present inventors elected to use a non-constant cross-section or thickness for the metal over the inductive sensor. For example, the interior-facing surface of the button that faces towards the inductive sensor coil may be planar, but the exterior-facing surface of the button may be non-planar, i.e., contoured (for example, having a concave profile, such as is shown in FIG. 1). Whereas membrane-type buttons, e.g., with constant-thickness button surfaces, may have a ridge or groove that encircles the outer perimeters of such buttons to facilitate tactile recognition of the button area by a user's finger, it is to be understood that such ridges/grooves are outside of the area of the button that is over the inductive sensor. In some implementations, at least 50%, 60% 70%, 80%, 90%, or 100% of the button area may be non-planar in cross-section.

In order to compensate for the increased stiffness provided by a non-planar button area, the gap in between the interior-facing surface of the housing facing the inductive sensor coil may be decreased, for example, to less than 0.15 mm. In some implementations, the gap between the interior-facing surface of the housing and the inductive sensor coil may be between 0.1 mm and 0.15 mm, whereas in other implementations, the gap may be decreased to even to less than 0.1 mm, e.g., 0.099 mm or less.

Figure 4:
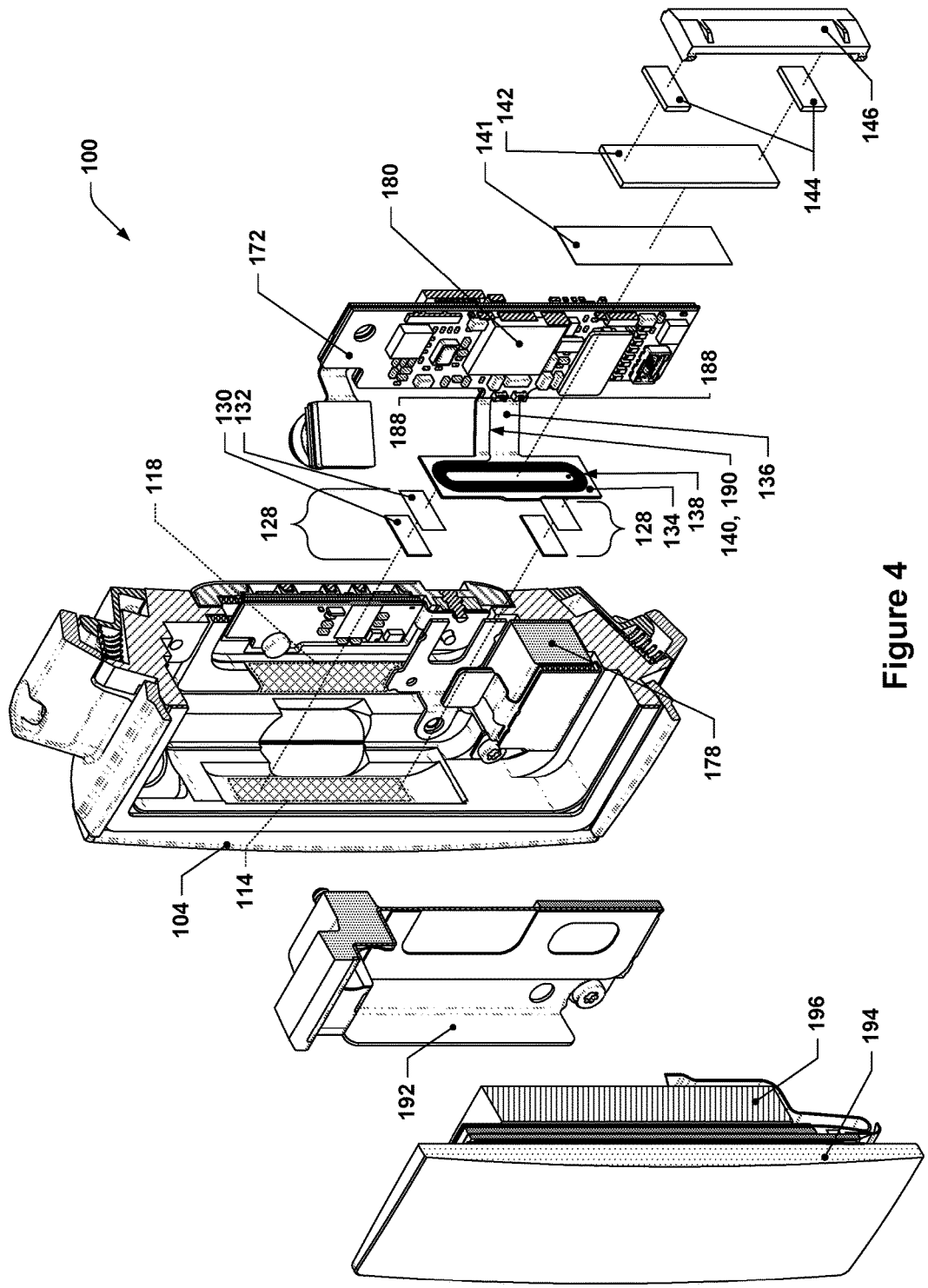
FIG. 4 depicts an exploded cutaway view of the apparatus of FIG. 2.

FIG. 4 depicts an exploded cutaway view of the apparatus of FIG. 2. The display 194 may include a cover glass (which the callout for display 194 actually points to), as well as one or more components located behind the cover glass, e.g., touch interfaces (if a touchscreen is used), a display layer, and potentially a backlight (if the display layer is, for example, a display that does not generate its own light). In some implementations, there may be other elements located within the same component stack between the cover glass and the battery 196, e.g., a near-field communications antenna and/or device, an RF antenna feeding element (such as a monopole antenna element connected to an RF chipset mounted on the printed circuit board 172 that may be RF electromagnetically coupled to the antenna bracket 192 to generate RF signal radiation).

FIG. 4 has the inductive button components removed, thus revealing a first interior surface 114 that faces towards a substrate 134 of the inductive button 106. In this example, the first interior surface 114 is perpendicular to the first axis 154, although in other implementations the normal to the first interior surface 114 may not be perpendicular to the first axis 154. It will be understood that references to the first axis 154 made herein may also or alternatively, unless otherwise apparent, refer to an axis that is perpendicular to first interior surface 114. The substrate may, for example, be a flexible printed circuit (FPC) 136, as shown, or may be provided by a conventional, rigid printed circuit board (PCB) in other implementations. The substrate may provide one or more inductive button coils 138 for the inductive button 106. In this example, an obround spiral inductive button coil 138 is shown which is about 4-5 times longer in length than width. In an obround spiral, each linear segment ends in a semi-circular end that is somewhat smaller in diameter than a previous semicircular end, allowing each linear segment to run parallel to, and offset from, adjacent linear segments. Such an obround spiral coil may have a long axis and a short axis; the sensitivity of such an inductive button coil may be governed by the coil dimensions along the short axis, while the coil dimensions along the long axis may extend the area within which the inductive coil is sensitive along the long axis. While not shown, a second inductive button coil of the same size (but opposite coil direction) may be located on the opposite side of the substrate 134, with the two inductive button coils 138 linked together in series (for example, by a via passing through the substrate 134—such a via is visible in the center of the lower semicircular portion of the inductive button coil 138). In this example, the inductive button coils each have exterior dimensions of approximately 8.3 mm±0.1 mm long by 2.8 mm±0.1 mm wide, and each have approximately 8 windings/coils/loops. In some implementations, there may be one or more inductive button coils are each obround, rectangular, or elliptical spiral in shape and may have a long dimension in a direction parallel to the substrate of approximately 8.3 mm±6 mm and a short dimension in another direction parallel to the substrate of 2.8 mm±2 mm. Such inductive button coils may have at least between 2 and 15 loops.

The input and output ends of the inductive button coil or coils 138 may be electrically coupled, via conductive paths 190 provided by conductive traces 140, to an inductance-to-digital converter (LDC) (not shown here), which may be provided by an integrated circuit mounted to a printed circuit board 172 that houses processors (such as processor 180), memory, and various other electronic components for providing functionality to the apparatus 100.

The substrate 134 may be offset from the first interior surface 114 by one or more compressive diodes 128, which may be interposed between the first interior surface 114 and the substrate 134.

A compressive diode, as the term is used herein, is a structure that is designed to only support compressive loading from one end of the compressive diode to the other, i.e., a tensile load cannot be transmitted through the compressive diode. Thus, for example, if a compressive diode has a first surface contacting a first part and a second surface opposite the first surface that contacts a second part, pushing the first part towards the second part will compress the compressive diode, thereby causing the compressive diode to exert a corresponding compressive load on the surfaces of the first and second parts contacting the compressive diode. In contrast, pulling the first part away from the second part would not cause any tensile load to be applied to either surface of the first and second part contacted by the compressive diode.

Structures that provide a tensile load path between two structures cannot be considered to be compressive diodes. Thus, for example, double-sided tape that is used to join together two structures would not be a compressive diode since such tape would not only transmit compressive forces between both components, but would also transmit tensile loads between the two components if one tried to pull the two components apart. Similarly, a threaded fastener used to connect two components would also not be a compressive diode since such a fastener would, when tightened, generate a tensile load.

The compressive diodes 128 shown in FIG. 4 are provided by a pair of spacers 130, e.g., PTFE or other non-viscoelastic material, and pressure sensitive adhesive (PSA) layers 132. The PSA layers 132 may be used to adhere the spacers 130 to the substrate 134, and may then be sandwiched between the substrate 134 and the first interior surface 114 during assembly. Alternatively, the order of the spacers 130 and the PSA layers 132 may be reversed to allow the spacers to be adhered to the first interior surface 114 instead.

In the depicted implementation, a stiffener 142 is provided to provide rigidity to the substrate 134 since the substrate 134 is provided by an FPC. The stiffener 142 may, for example, be glued to the substrate 134 or may, as shown, be attached to the substrate 134 with a PSA layer 142. In implementations in which the substrate 134 is already rigid, e.g., provided by a PCB, the stiffener 142 may be omitted if the substrate 134 itself has sufficient stiffness. The assembled substrate 134 and stiffener 142 (if used) may be compressed against the first interior surface 114 by the compressive load spreader 146, which may be a generally rigid part, e.g., made of plastic, metal, or other non-elastomeric material, that may be used to apply a compressive load to the substrate 134 and the stiffener 142 (if present). A set of compression spacers 144 may be interposed between the compressive load spreader 146 and the substrate 134. The compression spacers 144 may be made, for example, of a compliant material, such as elastomeric foam or rubber, to allow them to be compressed when load is applied to the compressive load spreader 146. The stiffener in FIG. 5, for example, may be approximately 0.4 mm thick and made of material such as FR4, which is a fire-resistant composite substrate for us in PCB manufacturing. An FPC, such as that used for substrate 134 in this example, may be only 0.14 mm thick, and may therefor benefit from the use of the stiffener 142 in order to increase its rigidity.

In some implementations, the substrate 134 and stiffener 142 may be replaced by a single rigid printed circuit board substrate 134, in which case the circuit traces providing the inductive coils may be printed directly on the stiffener, which may have a thickness in a range between 0.2 mm to 1.0 mm or larger.

Figure 5:
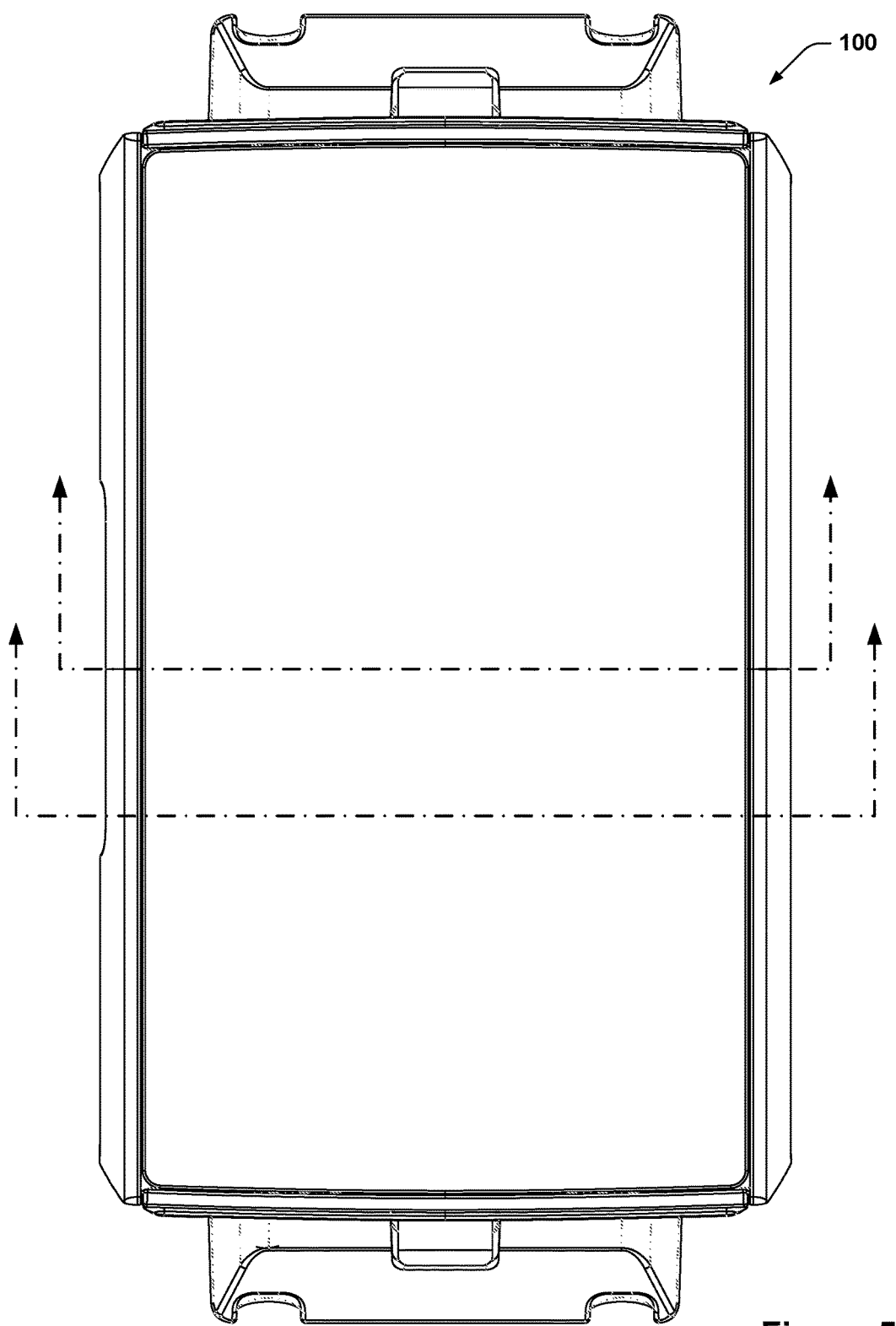
FIG. 5 depicts a top view of the example apparatus of FIG. 1 with two sectioning planes indicated.

FIG. 5 depicts a top view of the apparatus 100 with two sectioning planes indicated—one passes through the middle of the housing 104, and the other is parallel to the first but passes through the housing 104 at a location coincident with one of the ends of the inductive button 106.

Figure 6:
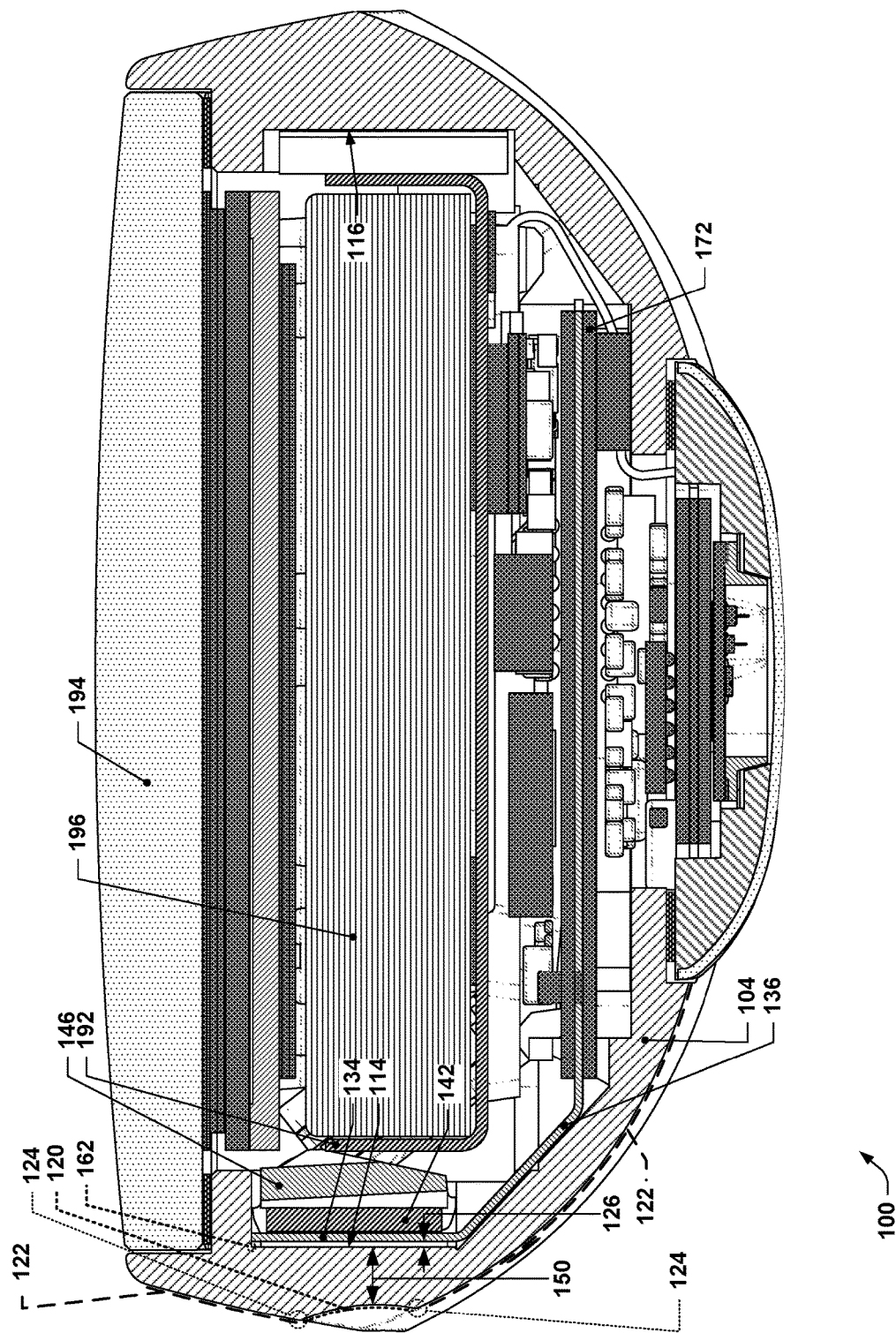
FIG. 6 shows a section view of the example apparatus of FIG. 5 through the middle sectioning plane.

FIG. 6 shows a section view of the apparatus 100 of FIG. 5 through the middle sectioning plane. In this view, the apparatus is completely assembled, and it is evident that the packaging within the device is extremely compact. In the depicted implementation, the display 194 (indicated cover glass and additional components in between the cover glass and the battery 196) may be one of only three openings in the housing. One other opening is the opening in the bottom for the heart rate monitor blister (the domed area protruding from the underside of the housing), and the last opening may be a small port 198 (see FIGS. 1 and 2) located in the housing near the inductive button 106 that may lead to a barometric pressure sensor in the example apparatus. Since the port, if present, would be sealed to the barometric pressure sensor, and the display 194 would be sealed to the housing 104, there would be no other entrance paths for moisture, allowing the apparatus to be waterproof, for example, for typical depths of water that may be encountered, e.g., 10 meters. The use of the inductive button 106 avoids the need to provide waterproofing around the button, since the inductive button 106 may be provided without any breaks in the surface of the housing. Moreover, the inductive button 106 may still function reliably while submerged, unlike other buttons that feature non-moving components, such as capacitive or resistive buttons. Such other types of buttons with non-moving components rely on changes in electrical properties on the surface or skin of the device, and would thus be affected by the environment surrounding the device. An inductive button, however, uses changes in the electrical field in the interior of the device caused by physical deformation of the housing to determine whether a button press has occurred. As a result, it is insensitive to moisture and will operate both in open air and underwater.

As can be seen, the first exterior surface 120 has a shallow arcuate profile, and has a minimum first distance 150 from the first interior surface 114 at the point where the first exterior surface 120 is closest to the first interior surface 114. The first exterior surface 120 transitions to the second exterior surfaces 122 at discontinuities 124, thereby providing a tactile cue to a user as to the location of the inductive button 106.

A first gap 126 may exist between the first interior surface 114 and the substrate 134; the first gap may, in this implementation and as discussed previously, be approximately 0.1 mm (FIG. 6 is shown at approximately 12× magnification, but is otherwise to scale). The substrate 134 is backed by the stiffener 142, which is compressed towards the first interior surface 114 by the compressive load spreader 146. In this example, the compressive load spreader 146 is held in place by the antenna bracket 192, although other implementations may provide alternative mechanisms for holding the compressive load spreader 146, stiffener 142, and/or the substrate 134 in place.

In the context of a wearable device housing, such as housing 104, the ability to machine or otherwise form precision features within the housing 104 may, in some instances, be very limited. For example, the first interior surface 114 of the depicted implementation is an undercut surface, i.e., a T-slot milling bit must be used. A T-slot milling bit is one that has cutting surfaces that extend beyond the diameter of the cutter shaft. Such a T-slot milling bit may be lowered into the central cavity of the housing 104 in a direction parallel to the third axis 158 until the cutting surfaces are at the elevation where the first interior surface 114 is shown. The T-slot milling bit may then be moved laterally, e.g., along the first axis 154 until it cuts into the interior side wall of the housing 104; the T-slot milling bit may also then be moved along the second axis 156 to mill out a slot that extends along the second axis 156 and provides the first interior surface 114. For example, in the depicted example housing 104, a first interior surface of approximately 12.2 mm in length and recessed approximately 1.3 mm from the interior edge of the housing was produced using a T-slot milling cutter of approximately 0.2" in diameter.

As will be readily apparent, it is not possible to perform a plunge bore on the interior of such a housing in order to provide the first interior surface 114 that is shown. This is because there is no access to the first interior surface 114 along the first axis 154, which is perpendicular to the first interior surface 114, due to the fact that a second interior surface 116 (and the sidewall of the housing 104 that provides the second interior surface 116) blocks the way.

The T-slot technique allows such a surface to be machined—however, the tolerances for such an operation may be difficult to maintain since the T-slot technique involves side-loading of the milling cutter, which will cause the depth of the first interior surface to potentially vary due to deflection of milling cutter. Such deflections make it impractical or impossible to machine steps in the first interior surface 114 that may be used to provide the first gap 126 (such steps would involve machining a step surface, and then machining the first interior surface to a depth only 0.1 mm or so deeper. Cutting both surfaces so as to have the desired offset distance would be extremely challenging when the tolerances of such cuts may be the same as the desired depth. As a result, for undercut first interior surfaces, such as the first interior surface 114, the first gap 126 is provided through the use of the compressive diodes 128, which are the same thickness as the first gap 126.

Figure 7:
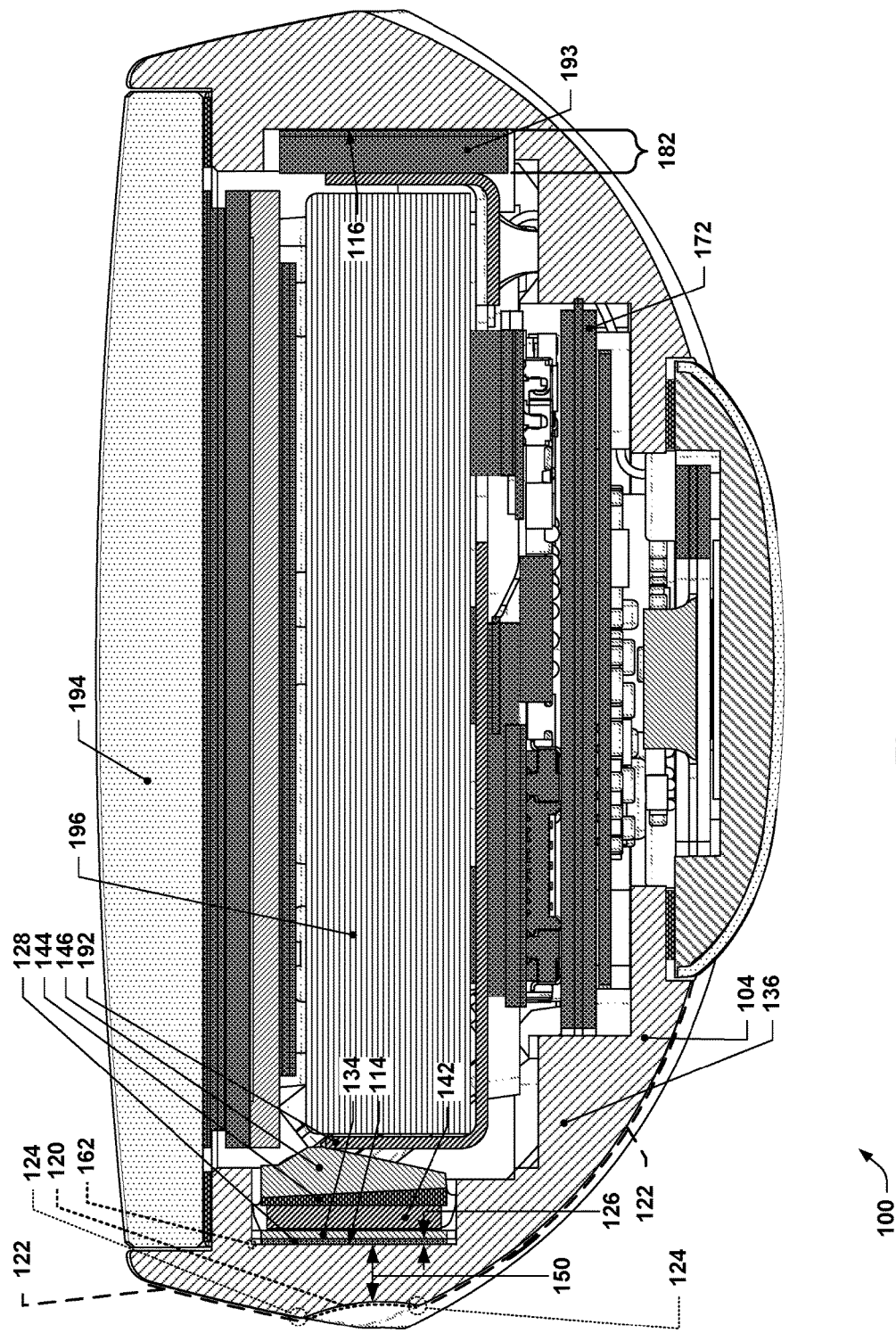
FIG. 7 shows a section view of the example apparatus of FIG. 5 through the other sectioning plane.

FIG. 7 shows a section view of the apparatus 100 of FIG. 5 through the other sectioning plane. In addition to the elements shown in FIG. 6, FIG. 7 also depicts the compressive diodes 128 interposed between the first interior surface 114 and the substrate 134 and the compressive spacers 144 between the stiffener 142 and the compressive load spreader 146.

In the depicted example, the compressive load spreader 146 is compressed through contact with the antenna bracket 192. In this particular instance, the antenna bracket 192 is in contact with both the compressive load spreader 146 and with an antenna spacer 193, which may be interposed between the antenna bracket 192 and the second interior surface 116. Once the inductive button assembly is inserted into the slot with the interior surface 114, the antenna bracket 192 may be inserted into the housing 104 and squeezed in between the compressive load spreader 146 and the antenna spacer 193, which may be separated by a distance that is smaller than the width of the antenna bracket 192. As a result, when the antenna bracket 192 is inserted into the housing 104, the antenna bracket 192 may cause the compressive spacers 144 to be compressed, thereby firmly pressing the inductive button assembly into the first interior surface 114 and preloading it. Thus, in this particular implementation, the inductive button assembly and the antenna bracket 192 form a single, integrated assembly that can not only provide inductive button functionality but can also provide RF antenna functionality.

During testing of some inductive button/slot antenna configurations, it was discovered that there was strong coupling between the inductive button coils 138 and the slot antenna; such coupling interfered with the performance of the slot antenna, compromising its effectiveness.

In order to prevent interference between the RF functionality of the slot antenna provided by the antenna bracket 192 and the housing 104 and the inductive button coils 138, two decoupling inductors 188 (see FIG. 4) may be placed in series with the inductive button coil or coils 138, with the inductive button coil or coils 138 electrically interposed between the decoupling inductors 188 and with each decoupling inductor 188 electrically interposed between the one or more inductive button coils 138 and the LDC chip/chipset. Generally speaking, the decoupling inductors 188 should be the closest electrical component (from an electrical schematic perspective, not necessarily a physical perspective) to the one or more inductive button coils 138. In this particular instance, the decoupling inductors 188 are surface-mount wire-wound coil inductors mounted to the PCB 172. In order to avoid compromising the effectiveness of the decoupling inductors 188, the decoupling inductors 188 may be placed at the edge of PCB and the ground plane of the PCB 172 may be caused to not extend to the area where the decoupling inductors 188 are mounted. For example, the ground plane of the PCB 172 may be prevented from extending to within 0.3 mm, 0.5 mm, or a larger distance of the decoupling inductors 188. In other implementations, the decoupling inductors 188 may, for example, be mounted to an FPC, such as to portions of an FPC that may bridge between the one or more inductive button coils 138 and the LDC.

In some implementations, each decoupling inductor 188 may, for example, have an inductance of 33 nH (nano-Henries) or more. If desired, each decoupling inductor 188 may be provided by a set of multiple smaller inductors that are chained together in series so as to essentially act as a single larger inductor. By contrast, the inductance of the inductive button coils 138, in such implementations, may range between 1 and 1.4 µH, e.g., approximately 1.2 µH in free space, e.g., approximately 2 orders of magnitude larger. In some implementations, the inductance of the inductive button coils 138 may range between 0.5 to 5 uH.

Due to the use of non-planar button surfaces, the displacement observed for inductive buttons such as the example inductive button discussed above may be much lower than may be observed with planar button surfaces. In order to compensate for such small potential button displacements, the first gap 126 may be made smaller than typically recommended for inductive buttons, thereby increasing the ratio of deflection amount to first gap size (which will correspondingly increase the amount of inductance change that occurs with such deflection). As discussed above, such first gap sizes may be less than 0.15 mm, or, in some cases, less than or less than or equal to 0.1 mm. However, the present inventors determined that when inductive buttons feature such small first gap sizes, it is preferable to use compressive diodes in between the button surface facing the inductive button coil(s) and the substrate housing the inductive button coil(s). The reason for this is discussed below with respect to FIGS. 9 and 10.

Figure 9:
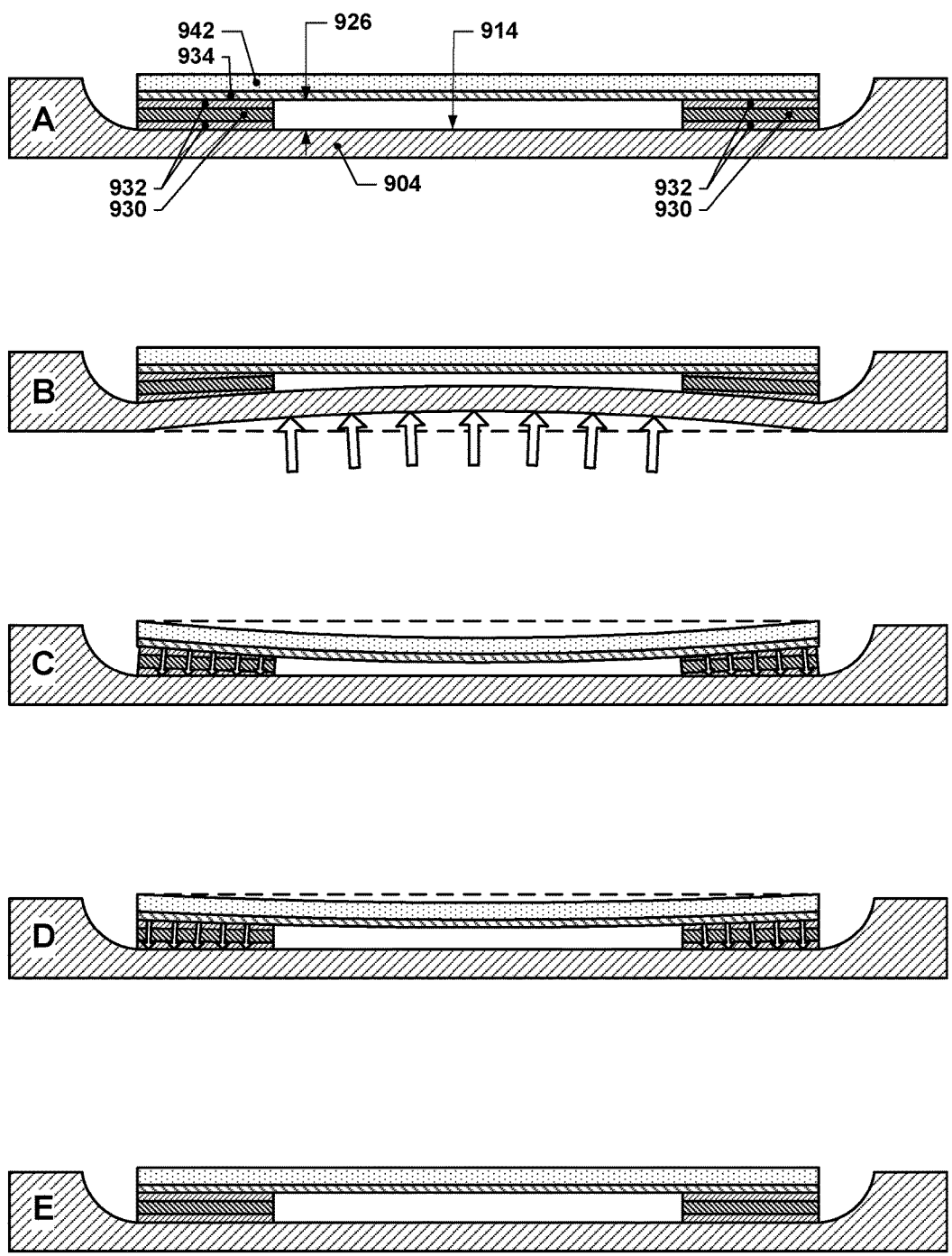
FIG. 9 depicts a simplified representation of an example inductive button.

FIG. 9 depicts a simplified representation of an example inductive button. The inductive button of FIG. 9, illustration A, includes a stiffener 942 that has mounted thereto a substrate 934 with an inductive coil facing towards a first interior surface 914 of a housing 904. In this example, the substrate 934 is spaced apart from the first interior surface 914 by two spacer stacks, each of which has a spacer 930 interposed between two layers of adhesive 932, to form a first gap 926. The adhesive layers 932 each adhere to the spacer 930 interposed between them, and also adhere to the first interior surface 914 and the substrate 934. This is illustrated in illustration A of FIG. HH.

In illustration B of FIG. 9, a distributed load has been applied to the housing 904, causing it to deflect inwards towards the substrate 934, thereby decreasing the first gap 926 between the first interior surface 914 and the inductive button coils on the substrate 934.

In illustration C of FIG. 9, the distributed load on the housing 904 has been removed. The housing, being made of metal, springs back to its undeformed state almost instantaneously. The adhesive layers 932, however, may include a viscoelastic adhesive, e.g., a pressure-sensitive adhesive. Viscoelastic materials exhibit both elastic and viscous characteristics and therefore exhibit time-dependent strain. As a result, a viscoelastic material subjected to compression will, once the compressive load is removed, return to its original shape, but may do so over a prolonged period of time as compared with the recover exhibited by an elastic material, such as steel or aluminum.

In the case of the present example, the deformation of the button in illustration B may cause the adhesive layers 932 to be compressed. Moreover, since the button "dishes" slightly when subjected to the distributed load, the edges of the button where the adhesive layers 932 are located may experience more compression closer to the middle of the button than at the perimeter of the button. The adhesive layer, having been compressed closer to the center than towards the edge, may be deformed so as to have a wedge-shaped cross-section, as seen in illustration B.

Once the distributed load is removed, the metal surface may recover nearly instantly, pulling the adhesive layers 932 and the spacers 930 with it. The adhesive layers 932, at this point, have not experienced sufficiently time yet to spring back to their original shape. This causes a tensile load to be applied to the substrate 934—with more tensile loading occurring closer to the center of the button (due to the increased displacement) than towards the edge of the button (due to less displacement). The substrate 934 and stiffener 942, in response to this loading, may deflect downwards towards the first interior surface 914. As a result, the first gap 926 may, immediately after release of the distributed load, generally remain at the same distance as shown in illustration B. Because of this, the inductance measured by the button electronics may not change appreciably, giving the appearance that the inductive button is still being pressed.

Over time, however, the adhesive layers 932 may gradually recover, reducing the tensile loading on the substrate 934 and stiffener 942 and allowing the substrate 934 and the stiffener 942 to return to their undeflected state. Illustration D shows the substrate 934 and stiffener 942 after returning about halfway to the fully undeflected state, and illustration E shows the substrate 934 and stiffener 942 in the fully undeflected state. At some point during this recovery, the first gap 926 will have opened up enough that the inductance change that results can be registered by the LDC as indicating that the button is no longer being pressed. However, due to the fact that some time has passed between when the distributed load was removed and when the button was registered as no longer being depressed, the user may be left with the impression that the button is malfunctioning. For example, it is common to provide some form of haptic feedback, e.g., a vibration pulse from a vibramotor (see, for example, vibramotor 178 in FIG. 4; vibramotors may include both rotating, eccentric mass vibramotors in which a rotating mass with a center of mass offset from the axis of rotation generates a rotational imbalance causing vibration as well as linear resonant actuators (LRAs), in which a mass is oscillated back and forth along a linear axis to produce vibration, or other types of vibration-inducing mechanisms), to a user that is triggered when an inductive button is pressed and also when it is released. If the user releases the button and the haptic feedback occurs a second or two later, for example, this may cause the user to think that the inductive button is malfunctioning.

This issue does not appear to occur for inductive buttons having larger first gap sizes, most likely because the thickness of the adhesive layers relative to the first gap size is much smaller, so the small amount of deflection in the substrate 934 that may be caused by the viscoelastic behavior of the adhesive layers 932 has a much smaller effect on the inductance of the device.

Figure 10:
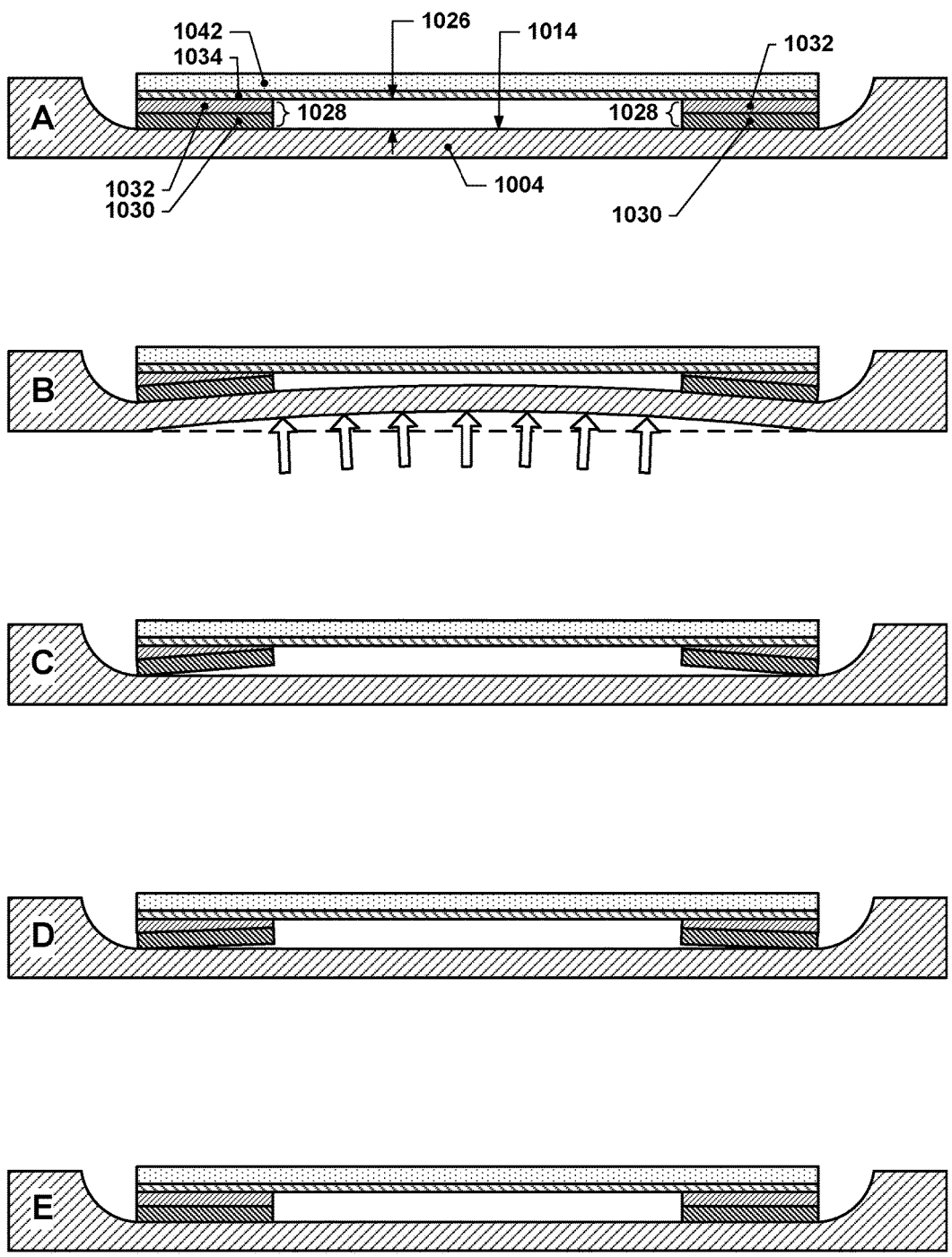
FIG. 10 depicts a simplified representation of an example inductive button using compressive diodes.

FIG. 10 depicts a simplified representation of an example inductive button using compressive diodes. Similar to the example inductive button of FIG. 9, the inductive button of FIG. 10, illustration A, includes a substrate 1034, a stiffener 1042, and a housing 1004. However, the first gap 1026, in this case, is defined by two compressive diodes 1028, each of which includes an adhesive layer 1032 and a spacer 1030. The adhesive layers 1032 adhere the spacers 1030 to the substrate 1034, but there is no adhesion between the spacers 1030 and the housing 1004.

In illustration B of FIG. 10, a distributed load similar to that of illustration B of FIG. 9 has been applied, resulting in similar compression of the adhesive layers 1032. In illustration C of FIG. 10, the distributed load has been removed, allowing the housing 1004 to return to its undeformed state. However, due to the fact that there is no tensile load path between the housing 1004 and the substrate 1034 through the compressive diodes 1028, when the housing 1004 returns back to its undeformed state, it does not put the compressive diodes 1028 in tension and thus does not cause the substrate 1034 to bend. As a result, the first gap 1026 between the substrate 1034 and the first interior surface 1014 returns to the state shown in illustration A of FIG. 10 simultaneously with the restoration of the housing 1004 to its undeformed state. This causes the LDC to register that the inductive button is no longer being pushed at the same time that the force on the inductive button is removed. This avoids the delayed release behavior discussed with respect to the implementation of FIG. 9. As can be seen in illustration D of FIG. 10, the compressive diodes 1028 will slowly return to their undeformed state over time, eventually returning to the state shown in illustration E of FIG. 10.

Thus, for small-gap inductive buttons, e.g., with first gaps of 0.1 mm or less (or possibly less than as much as 0.15 mm), the use of compressive diodes may allow the delayed release behavior discussed above to be avoided while still allowing for the use of adhesively-backed spacers.

Figure 8:
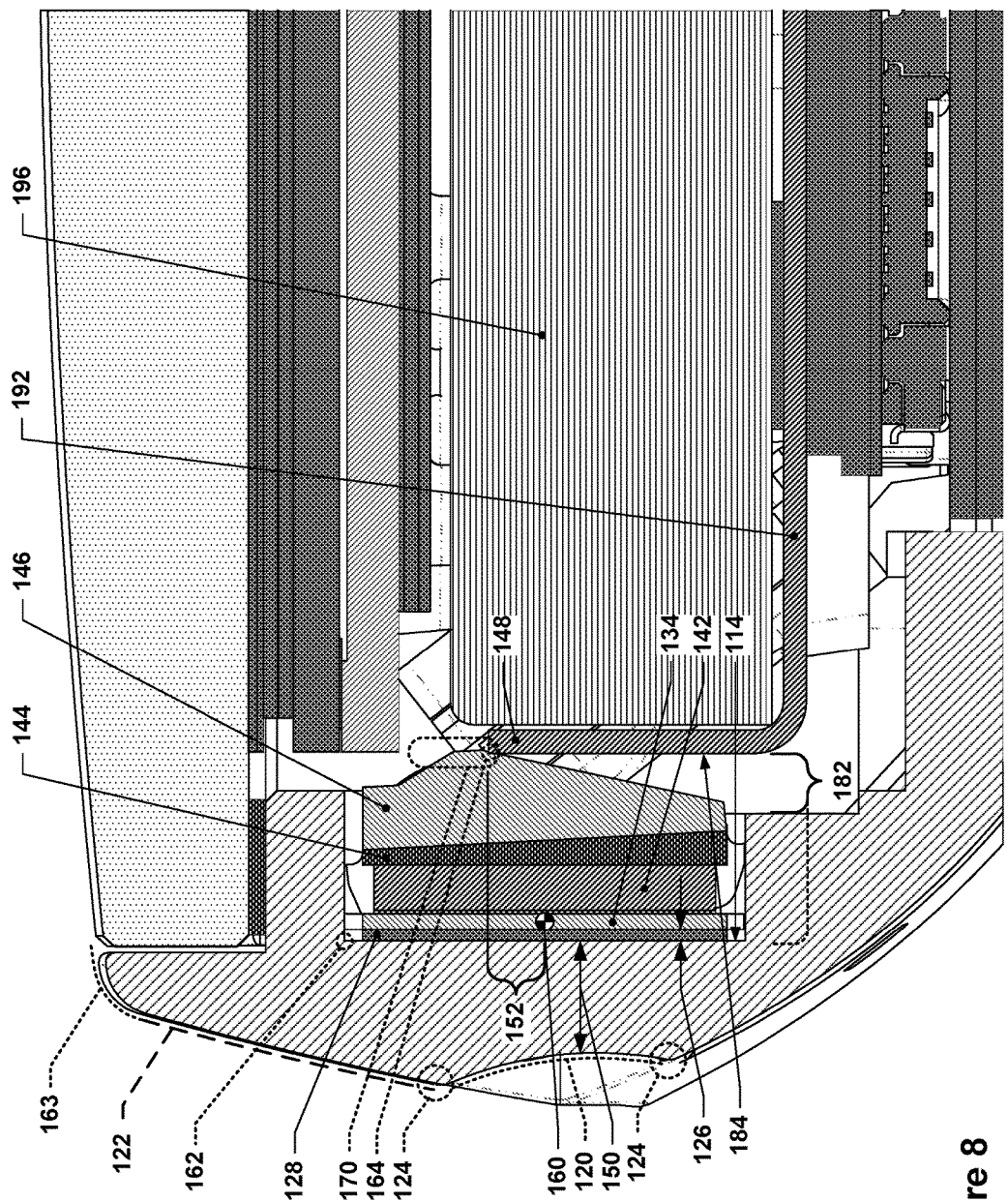
FIG. 8 is a detail view of FIG. 7.

Another potentially useful feature that may be included in some implementations of such small-gap inductive buttons is to provide an off-center compressive load on the substrate and inductive coils, as will be discussed below with respect to FIG. 8. FIG. 8 is a detail view of FIG. 7. In FIG. 8, some additional elements have been indicated with callouts. For example, the contact area 164 where the compressive load spreader 146 contacts the antenna bracket 192 is indicated. As can be seen, the contact area 164, which may be thought of in simplified form as the centroid of the contact load placed thereupon, is offset from a center axis 160 of the inductive coils 138 (the center axis 160, in this case, generally passing through the midpoint of the inductive coils 138 and extending along the second axis 156) along a direction parallel to the first interior surface 114 by a load offset distance 152. This causes a higher magnitude compressive load to be applied along the upper part of the substrate 134 (relative to the contact area 164 and the orientation of FIG. 8) than to the lower part of the substrate 134. In some implementations, the contact area 164 may have a load centroid that is located within, for example, a first region 170. In some implementations, the first region 170 may extend between 25% and 75% of the distance from the upper edge of the first interior surface 114 to the center axis 160. In the implementation shown, the contact point between the compressive load spreader 146 and the antenna bracket 192 is along the upper edge of the antenna bracket 192, although other implementations may feature a more distributed loading, e.g., the antenna bracket 192 may be designed to be taller so that the compressive load spreader 146 bears against the side surface of the antenna bracket 192 instead of the edge thereof.

As a result, the first gap 126 may be somewhat narrower near the upper edge 162 of the first interior surface 114 than near the lower edge of the first interior substrate 114. Due to the reduced first gap 126 near the upper edge 162, the inductive button assembly may have increased sensitivity to loads applied to the upper portion of the housing 104. For example, if the housing 104 is for a wearable device, the device may be worn in a manner that makes it perhaps more difficult for a user to press directly on the side of the housing 104 to activate an inductive button. In such devices, the device may be thin enough and may be worn close enough to the wearer's skin that there may not be sufficient clearance between the "center" of the button and the wearer's skin to allow a finger to apply a load centered on that center point. The user is far more likely to press along the upper portion of the side surface, further from the skin—for example, along exterior upper edge 163 of the housing and/or the second exterior surface 122 adjacent thereto. As a result, there may typically be more force applied to the housing 104 nearer the top of the housing, near the exterior upper edge 163, than near the bottom of the housing. Moreover, since such housings may frequently be "cup" shaped, e.g., having little or no material in the region of the display, but having metal side walls and a metal bottom, pressure applied near the upper "rim" (such as the exterior upper edge 163) of such a "cup" may cause more deflection in the housing 104 than the same amount of pressure applied closer to the base of the "cup."

As a result of such increased potential deflection, inductive buttons in such housings may have an increased sensitivity to button-press loads that are applied along the exterior upper edge of such housings as compared with button-press loads that are delivered to a point centered on the inductive button coils 138 and along a direction parallel to the first axis 154. If an off-center load is then applied to the substrate 134, the sensitivity of such inductive buttons may be further increased, thereby reducing the amount of force that needs to be applied to the inductive button in order to activate it. Thus, off-center loading of the substrate 134 may provide an advantageous increase in inductive button sensitivity and/or a reduction in actuation force, thereby enhancing user experience.

Also visible in FIG. 8 is slot antenna gap 182, which may extend from a conductive surface 184 of the antenna bracket 192 to the facing side wall of the housing 104, e.g., the closest adjacent side wall of the housing 104 or to the first interior surface 114. The slot antenna gap 182 may, for example, range between 0.5 mm and 1.7 mm. In some implementations, the slot antenna gap 182 may vary in width along the length of the gap. For example, the slot antenna gap 182 may widen in the region where a milled recess is for the inductive button components, as indicated by the dotted extension to the bracket for slot antenna gap 182.

Another issue that was identified by the present inventors in the use of inductive buttons in small-size housings, such as wearable device housings, is that the placement of the LDC itself could affect performance of the inductive button. In small-size housings, plastic or other non-conductive spacers may be placed in a stacked arrangement with circuit boards of the device to support the circuit boards within the housing. This not only provides support to the circuit boards, but also reduces the number of screwed connections that may be needed (or may, in some cases, completely eliminate the need for screws).

Figure 11:
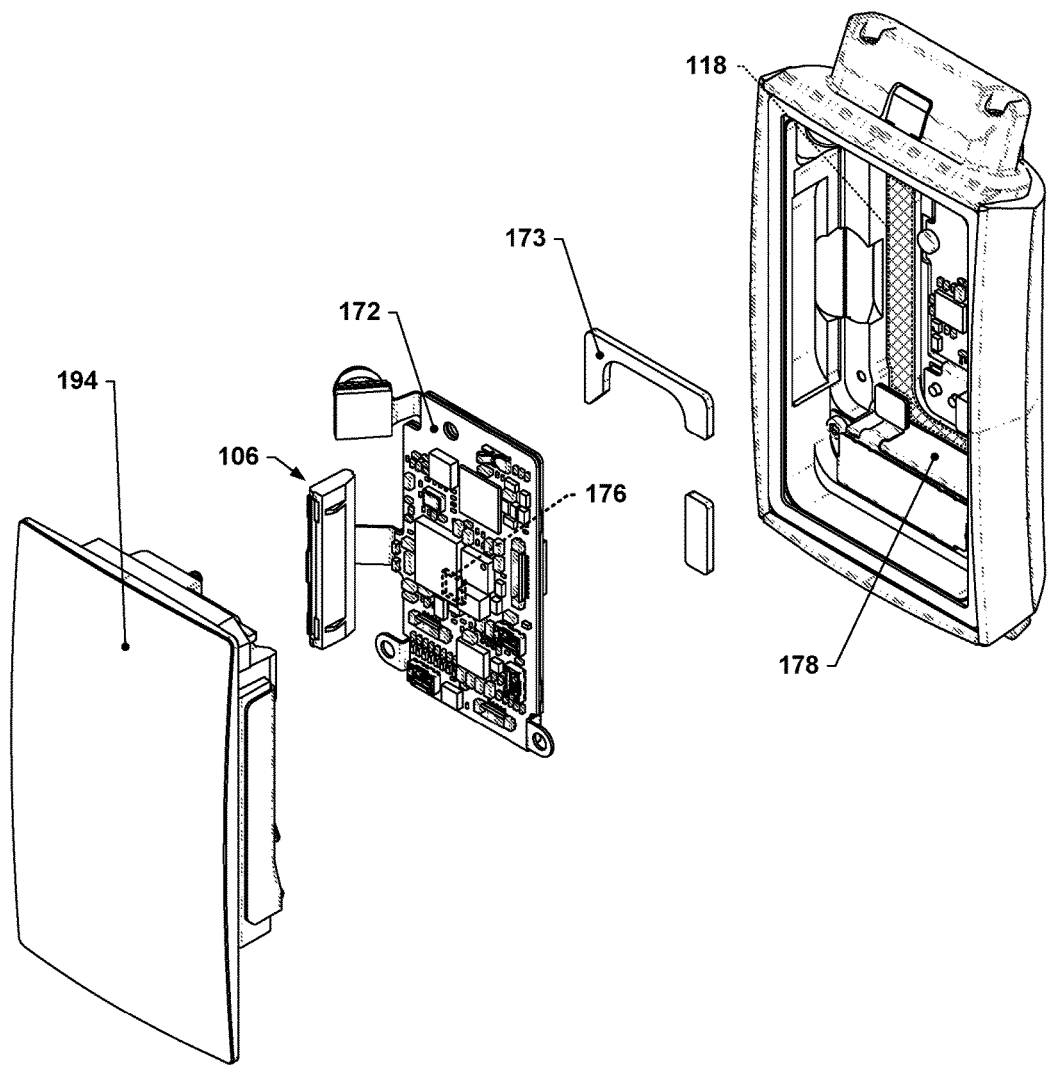
FIG. 11 depicts another exploded view of the apparatus of FIG. 2.

FIG. 11 depicts another exploded view of the apparatus of FIG. 2. As shown in FIG. 11, the PCB 172 has a PCB support 173 that is sandwiched between the PCB 172 and a bottom interior surface 118 of the housing 104. The PCB support 173, in this instance, includes two separate pieces, although other implementations may feature a unibody construction or may feature additional pieces. The PCB support 173 may, for example, be made from a polycarbonate material or other electrically non-conductive, generally rigid material that may, optionally, be adhered to the PCB 172 and/or the bottom interior surface 118. In this particular example, three screws may be used to secure the PCB 172 to the housing 104, and the PCB spacer 173 may be used to provide additional support to the underside of the PCB 173. The PCB 172 may have an LDC 176, for example, that is mounted, in this case, to the backside of the PCB 172.

FIGS. 12 and 13 depict plan views of the interior of the apparatus 100, with different PCB spacers shown in each Figure. In FIG. 12, the PCB spacer 173' extends all the way down past the LDC 176 on the left side, coming within a millimeter or two of the LDC 176. However, it was discovered that loads applied to the back side of the housing 104, for example, to the optical blister on the back side that contained a skin-facing heart rate sensor, caused the inductive button 106 to register a button press, even when no pressure was applied to the inductive button 106. The present inventors eventually discovered that minor loads applied to the bottom of the housing 104 caused the LDC 176 to flex slightly; this flexure caused enough mechanical distortion in the LDC 176 that the electrical operation of the LDC 176 became compromised and caused the LDC 176 to generate inductance change readings that indicated that a button press had occurred, even when a button press had not occurred.

After isolating this unexpected issue, it was determined that the PCB spacer 173' should be modified so as to avoid having any compressive load paths between the interior bottom surface 118 and the PCB 172 within a region, e.g., a circular region, 174 around the LDC 176. Such a region 174 may, for example, extend at least 0.5 mm or 0.4 mm from the LDC 176 in all directions in the plane of the PCB 172. Such mechanical isolation was found to adequately protect the LDC 176 from potential mechanical interference from backside loading of the housing 104, thereby significantly reducing or eliminating potential false button-press events. Thus, for spacer-backed PCBs, it may be advantageous to avoid contact between the PCB and the spacer in an exclusion region around the LDC, e.g., 0.5 mm to 0.4 mm from the center of the LDC.

While the concepts discussed herein were developed for use in wrist-wearable devices, such as fitness trackers or watches, such concepts may also be generally applicable to any electronic device in which inductive user interface elements may be implemented, especially in devices that are space-constrained, e.g., wearable devices, cell phones, pocket cameras, headphones or headsets, etc.

It is to be understood that the phrase "generally parallel," with respect to an edge, refers to an edge that is, if linear, parallel or within a few degrees of parallel, e.g., within 1-5 degrees of parallel. Furthermore, it is to be further understood that a non-linear edge, e.g., a gently curved edge, for example, may also be considered parallel to another edge or surface/plane. In such cases, the curved edge may be considered to approximate a linear edge, e.g., a line that has a minimum average shortest distance from each point along the curved edge.

It is to be understood that the phrase "for each <item> of the one or more <items>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus comprising:
   a housing having a first interior surface;
   a substrate proximate to the first interior surface and separated from the first interior surface by a first gap along a first axis perpendicular to the first interior surface, wherein the substrate includes one or more inductive button coils; and
   one or more compressive diodes interposed between the first interior surface and the substrate, wherein:
   the first interior surface is planar,
   the one or more compressive diodes have a thickness in a direction perpendicular to the first interior surface that is equal to the first gap, and
   the first interior surface, the substrate, the one or more inductive button coils, and the one or more compressive diodes form part of an inductive button.

2. The apparatus of claim 1, wherein the first gap is between 0.02 mm and 0.2 mm.

3. The apparatus of claim 1, wherein the first gap is less than or equal to 0.1 mm.

4. The apparatus of claim 1, wherein the first gap is less than 0.1 mm.

5. The apparatus of claim 1, wherein:
   the one or more inductive button coils includes a first inductive button coil with an obround, rectangular, or elliptical spiral shape having a long dimension in a direction parallel to the substrate of approximately 8.3 mm±6 mm and a short dimension in another direction parallel to the substrate of 2.8 mm±2 mm, and
   the first inductive button coil has at least between 2 and 15 loops.

6. The apparatus of claim 5, wherein:
   the one or more inductive button coils includes a second inductive button coil identical to the first inductive button coil but located on a different layer of the substrate and coiling in an opposite direction, and
   the first inductive button coil is in electrical series with the second inductive button coil.

7. The apparatus of claim 1, wherein:
   the one or more compressive diodes each include a spacer layer and an adhesive layer,
   the adhesive layer adheres a first side of the spacer layer to the substrate, and
   a second side of the spacer layer contacts the first interior surface without adhesion.

8. The apparatus of claim 1, wherein:
   the one or more compressive diodes each include a spacer layer and an adhesive layer,
   the adhesive layer adheres a first side of the spacer layer to the first interior surface, and
   a second side of the spacer layer contacts the substrate without adhesion.

9. The apparatus of claim 1, further comprising:
   an inductance-to-digital converter (LDC) electrically coupled to the one or more inductive button coils and configured to measure changes in inductance of the one or more inductive button coils responsive to deformation of the first interior surface.

10. The apparatus of claim 9, further comprising:
    a vibramotor; and
    a controller including a memory and one or more processors, wherein:
    the one or more processors, the memory, the vibramotor, and the LDC are operatively connected, and
    the memory stores instructions for controlling the one or more processors to:
    receive a signal from the LDC indicative of a change in inductance of the one or more inductive button coils, and
    cause the vibramotor to generate a vibratory output responsive to the signal.

11. The apparatus of claim 9, further comprising a first printed circuit board (PCB), wherein:
    the LDC is mounted to a surface of the first PCB that faces towards a bottom interior surface of the housing,
    the first PCB is mounted in the housing such that there are no compressive load paths between the bottom interior surface of the housing and the first PCB within a first region centered on the LDC, the first region is, when viewed along the first axis, a circular region with a diameter of at least 4 mm, and the LDC is, due to the absence of the compressive load paths within the first region, substantially mechanically isolated from deflections in the housing, thereby reducing electrical transients caused by flexure of the LDC.

12. The apparatus of claim 11, further comprising one or more PCB spacers interposed between the first PCB and the bottom interior surface, the one or more PCB spacers providing compressive load paths between the first PCB and the bottom interior surface, wherein each PCB spacer is a generally planar piece of electrically non-conductive material.

13. The apparatus of claim 1, wherein:
the housing has a second interior surface,
the first interior surface faces towards the second interior surface such that a normal of the first interior surface intersects with the second interior surface, and
the first interior surface is an undercut surface.

14. The apparatus of claim 1, wherein:
the housing includes a first exterior surface that overlaps with the first interior surface when viewed along the first axis,
the first exterior surface is less than or equal to 20 mm in length and less than or equal to 12 mm in width,
the housing further includes one or more second exterior surfaces that are adjacent to the first exterior surface, wherein the first exterior surface forms a discontinuity in the one or more second exterior surfaces,
a first distance between the first interior surface and the first exterior surface in a direction parallel to the first axis is less than or equal to 1.5 mm, and
the first distance is the shortest distance between the first interior surface and the first exterior surface.

15. The apparatus of claim 13, wherein the first exterior surface has a concave cross-section.

16. The apparatus of claim 1, further comprising a stiffener, wherein:
the substrate and the one or more compressive diodes are interposed between the first interior surface and the stiffener,
the substrate is a flexible printed circuit (FPC) with conductive traces that provide the one or more inductive button coils,
the substrate is adhered or bonded to the stiffener, and
the stiffener has a Young's modulus of at least 15 GPa and a thickness of 0.3 mm or higher.

17. The apparatus of claim 16, further comprising:
one or more compression spacers;
a compressive load spreader; and
a load structure, wherein:
the one or more compression spacers are made of an elastomeric material,
the one or more compression spacers are interposed between the compressive load spreader and the stiffener,
the compressive load spreader is made of a non-elastomeric material, and
the load structure is configured to apply a compressive load to the compressive load spreader, thereby clamping the substrate in place relative to the housing.

18. The apparatus of claim 17, wherein:
the housing is for a wrist-wearable device;
the first interior surface has an upper edge that is located furthest from the person's wrist when the apparatus is worn on the person's wrist; and
the load structure and the compressive load spreader are configured to transfer compressive loads from the load structure to the compressive load spreader through a contact area with a load centroid that is, when viewed along the first axis, in a region interposed between the upper edge and a center axis that is generally parallel to the upper edge and that passes through a point located in the middle of the one or more inductive coils when viewed along the first axis.

19. The apparatus of claim 18, wherein:
the upper edge and the center axis are separated by a first distance when viewed along the first axis, and
the region extends from 25% of the first distance to 75% of the first distance.

20. The apparatus of claim 1, further comprising:
a slot antenna formed, at least in part, by the first interior surface of the housing and an electrically conductive surface offset from the first interior surface along the first axis;
one or more radio-frequency system components configured to generate or receive radio-frequency signals using the slot antenna;
an inductance-to-digital converter (LDC) electrically coupled to the one or more inductive button coils via a plurality of electrically conductive paths and configured to measure changes in inductance of the one or more inductive button coils responsive to deformation of the first interior surface; and
a plurality of decoupling inductors, wherein:
the housing is electrically conductive,
each decoupling inductor is located in series along a corresponding one of the electrically conductive paths such that electrical current flowing through each electrically conductive path flows through the corresponding decoupling inductor,
the substrate and the one or more inductive button coils are interposed between the first interior surface and the electrically conductive surface, and
the decoupling inductors do not overlap with the one or more inductive coils when viewed along the first axis.

21. The apparatus of claim 20, wherein:
the slot antenna is sized to provide functionality in the 2.4 to 2.5 GHz frequency band range, and
each decoupling inductor has an inductance of 33 nH or higher.

* * * * *

UNITED STATES PATENT AND TRADEMARK OFFICE
CERTIFICATE OF CORRECTION

PATENT NO. : 10,537,039 B2
APPLICATION NO. : 16/194038
DATED : January 14, 2020
INVENTOR(S) : Aditya Vivekanand Nadkarni et al.

It is certified that error appears in the above-identified patent and that said Letters Patent is hereby corrected as shown below:

In the Claims

In Claim 15, Column 19, Line 35, the reference to "claim 13" should be changed to "claim 14".

In Claim 18, Column 20, Line 18, "the one or more inductive coils" should be changed to "the one or more inductive button coils".

In Claim 20, Column 20, Lines 50-51, "the one or more inductive coils" should be changed to "the one or more inductive button coils".

Signed and Sealed this
Thirty-first Day of March, 2020

Andrei Iancu
*Director of the United States Patent and Trademark Office*